(12) United States Patent
Kumamoto et al.

(10) Patent No.: US 10,580,346 B2
(45) Date of Patent: Mar. 3, 2020

(54) DISPLAY DEVICE INCLUDING A PLURALITY OF FLEXIBLE LED MOUNTING BOARDS

(71) Applicant: Panasonic Intellectual Property Management Co., Ltd., Osaka (JP)

(72) Inventors: Yasuhiro Kumamoto, Osaka (JP); Tomonari Oogami, Osaka (JP); Takamitsu Isono, Osaka (JP); Koujirou Higa, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/086,403

(22) PCT Filed: Feb. 17, 2017

(86) PCT No.: PCT/JP2017/005866
§ 371 (c)(1),
(2) Date: Sep. 19, 2018

(87) PCT Pub. No.: WO2017/169262
PCT Pub. Date: Oct. 5, 2017

(65) Prior Publication Data
US 2019/0103050 A1 Apr. 4, 2019

(30) Foreign Application Priority Data
Mar. 30, 2016 (JP) .................. 2016-069707

(51) Int. Cl.
*G09G 3/3208* (2016.01)
*G09G 3/22* (2006.01)
(Continued)

(52) U.S. Cl.
CPC .................. *G09G 3/22* (2013.01); *F21S 2/00* (2013.01); *F21V 19/00* (2013.01);
(Continued)

(58) Field of Classification Search
CPC .................................................. G09G 3/3208
See application file for complete search history.

(56) References Cited

U.S. PATENT DOCUMENTS

| 9,030,427 B2 | 5/2015 | Yasumatsu |
| 2005/0231490 A1* | 10/2005 | Golan ...................... G09F 9/33 345/204 |

(Continued)

FOREIGN PATENT DOCUMENTS

| JP | 2005-136224 | 5/2005 |
| JP | 2011-090977 | 5/2011 |

(Continued)

OTHER PUBLICATIONS

Extended European Search Report dated May 22, 2019 issued in corresponding European Patent Application No. 17773810.1.
(Continued)

*Primary Examiner* — Roy P Rabindranath
(74) *Attorney, Agent, or Firm* — McDermott Will & Emery LLP

(57) ABSTRACT

A display device includes: a display panel that displays an image; a plurality of mount boards having long-length shaped disposed along the display panel; and light emitting elements arrayed on each of the plurality of mount boards in a longitudinal direction of each of the plurality of mount boards. The light emitting elements emit light toward the display panel from behind the display panel, and are arranged in a matrix shape along the display panel. The display device further includes: a back surface board on which the plurality of mount boards is stuck by an adhesive member; and a reflective sheet mounted to the back surface board. The reflective sheet has holes that allow the light emitting elements to pass through at positions corresponding to the light emitting elements, and reflects the light emitted (Continued)

from the light emitting elements toward the display panel. Each of the plurality of mount boards is constituted of a flexible wiring board.

5 Claims, 10 Drawing Sheets

(51) Int. Cl.
F21V 19/00 (2006.01)
F21S 2/00 (2016.01)
G02F 1/1335 (2006.01)
G02B 27/09 (2006.01)
H01L 27/32 (2006.01)
H05K 1/18 (2006.01)

(52) U.S. Cl.
CPC ... *G02B 27/0977* (2013.01); *G02F 1/133605* (2013.01); *H01L 27/3241* (2013.01); *H05K 1/189* (2013.01); *G02F 1/133603* (2013.01); *G02F 2001/133612* (2013.01); *G02F 2202/28* (2013.01)

(56) References Cited

U.S. PATENT DOCUMENTS

| 2011/0096265 | A1* | 4/2011 | Murakoshi | G02F 1/133603 |
| | | | | 349/64 |
| 2012/0181560 | A1 | 7/2012 | Hiramatsu et al. | |
| 2015/0023001 | A1 | 1/2015 | Lee et al. | |
| 2016/0282545 | A1* | 9/2016 | Hirayama | G02B 6/002 |

FOREIGN PATENT DOCUMENTS

| JP | 2012-151191 | 8/2012 |
| JP | 2013-143218 | 7/2013 |
| WO | 2011/062085 | 5/2011 |

OTHER PUBLICATIONS

International Search Report of PCT application No. PCT/JP2017/005866 dated May 9, 2017.

* cited by examiner

DISPLAY DEVICE INCLUDING A PLURALITY OF FLEXIBLE LED MOUNTING BOARDS

This application is a U.S. national stage application of the PCT International Application No. PCT/JP2017/005866 filed on Feb. 17, 2017, which claims the benefit of foreign priority of Japanese patent application No. 2016-069707 filed on Mar. 30, 2016, the contents all of which are incorporated herein by reference.

TECHNICAL FIELD

The present disclosure relates to a display device that displays an image, such as a still image or a moving image.

BACKGROUND

As a display device, such as a television device or a computer monitor, there is a thin display device, of a liquid crystal panel, an organic electro luminescence (EL) display panel, or the like.

A liquid crystal display device is a display device that does not spontaneously emit light. Therefore, in the liquid crystal display device, light emitting elements, such as light emitting diodes (LEDs), are disposed on a back surface (a surface opposite to a surface viewed by a user) of a display panel included in the display device, and light emitted from the LEDs and transmitted through the display panel reaches a user. Consequently, the user can visually recognize an image even in a dark place or the like.

In the display device having this configuration, for example, light emitting elements, such as LEDs, are arranged at intervals in a matrix shape. Accordingly, the display device may include a reflective sheet for reflecting, to a display panel side, light that advances to a side opposite to the display panel after being emitted from the light emitting elements.

For example, PTL 1 discloses a display device in which a reflective sheet is mounted on a back surface board.

CITATION LIST

Patent Literature

PTL 1: Unexamined Japanese Patent Publication No. 2013-143218

SUMMARY

In a display device equipped with light emitting elements, such as LEDs, power supplied to the LEDs may be lost due to a heat loss of the LEDs. Alternatively, since a reflective sheet is lifted from a predetermined position to cause a gap on a rear surface side of the reflective sheet (hereinafter, this state is also referred to as a lift of the reflective sheet), an optical loss (a partial loss of light emitted from the light emitting elements) may occur.

The present disclosure is to provide a display device capable of reducing a heat loss and an optical loss.

The display device according to the present disclosure includes: a display panel that displays an image; a plurality of mount boards having long-length shaped disposed along the display panel; and light emitting elements arrayed on each of the plurality of mount boards in a longitudinal direction of each of the plurality of mount boards. The light emitting elements emit light toward the display panel from behind the display panel, and are arranged in a matrix shape along the display panel. The display device further includes: a back surface board on which the plurality of mount boards is stuck by an adhesive member; and a reflective sheet mounted to the back surface board. The reflective sheet has holes that allow the light emitting elements to pass through at positions corresponding to the light emitting elements, and reflects the light emitted from the light emitting elements toward the display panel. In the display device, each of the plurality of mount boards is constituted of a flexible wiring board.

The display device according to the present disclosure can reduce a heat loss and an optical loss.

DESCRIPTION OF EMBODIMENT

Figure 1:
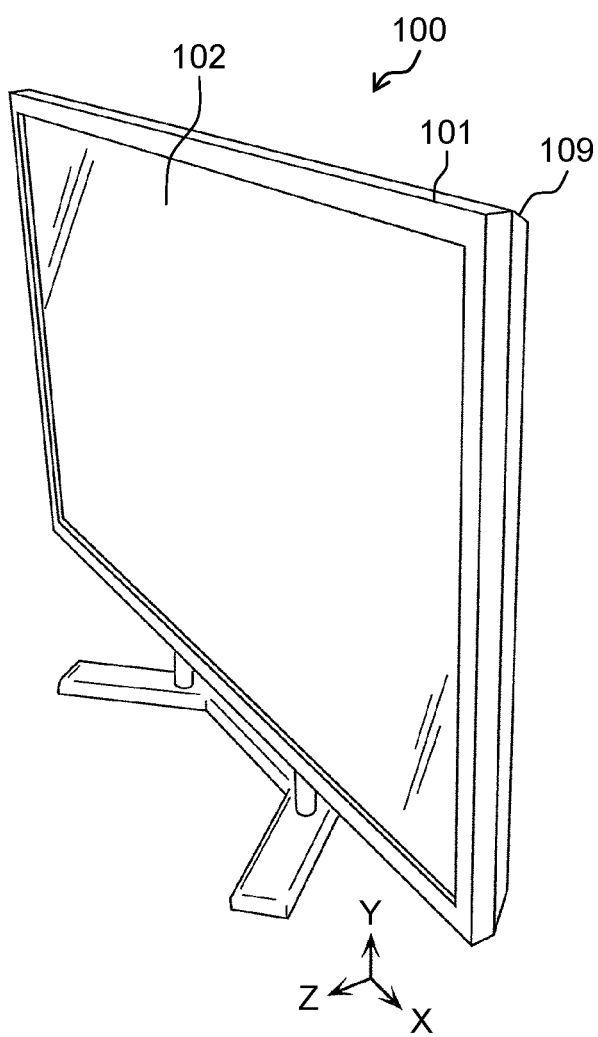
FIG. 1 is a perspective view schematically illustrating an example of an external appearance of a display device according to a first exemplary embodiment.

Hereinafter, an exemplary embodiment will be described in detail with reference to the drawings as appropriate. However, detailed descriptions that are more than necessary may be omitted. For example, a detailed description of a matter that has been already known well, or an overlapped description for a substantially identical configuration may be omitted. This is to avoid unnecessary redundancy of the following description and facilitate the understanding of those skilled in the art.

Note that the attached drawings and the following description are provided for those skilled in the art to fully understand the present disclosure, and only indicate an example of a display device according to the present disclosure. Therefore, the attached drawings and the following description are not intended to limit the subject matter as described in the claims. The scope of the present disclosure is defined by the recitations in the claims with the following exemplary embodiment used as a reference and thus is not limited to the following exemplary embodiment only. Therefore, among components in the following exemplary embodiment, components that are not recited in an independent claim indicating the most generic concept of the present disclosure are not necessarily essential for achievement of the object of the present disclosure but are described as preferable components.

In addition, the drawings are not always strictly illustrated, and are schematic views in which emphasis, omission, and proportion adjustment are made as appropriate for illustration of the present disclosure. The drawings may have shapes, positional relationships and proportions that differ from actual shapes, actual positional relationships, and actual proportions. Further, in the drawings, substantially identical components are denoted by identical reference marks, and descriptions of those components may be omitted or simplified.

First Exemplary Embodiment

[1-1. Outline of Configuration of Display Device]

FIG. 1 is a perspective view schematically illustrating an example of an external appearance of display device 100 according to a first exemplary embodiment.

Figure 2:
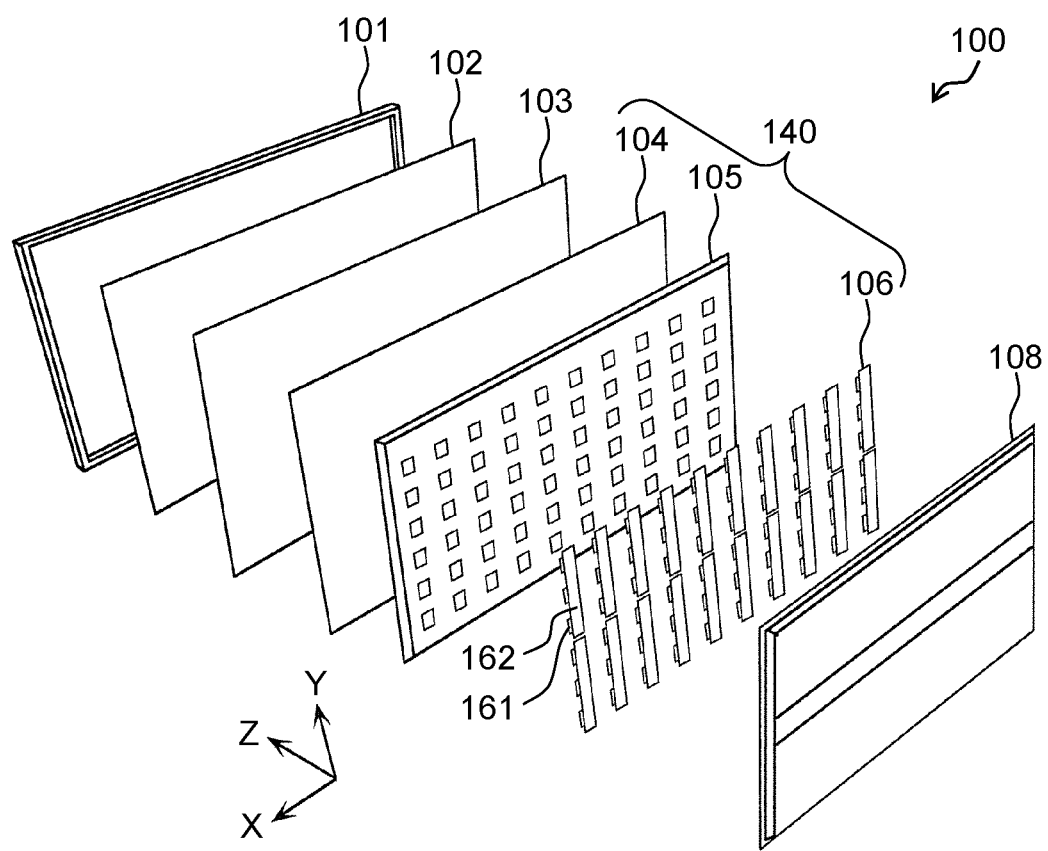
FIG. 2 is an exploded perspective view schematically illustrating an example of a structure of the display device according to the first exemplary embodiment.

FIG. 2 is an exploded perspective view schematically illustrating an example of a structure of display device 100 according to the first exemplary embodiment.

Note that FIGS. 1 and 2 schematically illustrate a rough configuration of display device 100, and details of the configuration are omitted.

Note that, hereinafter, an X-axis, a Y-axis, and a Z-axis are used as required to describe the present exemplary embodiment. In the present exemplary embodiment, for the sake of convenience, a direction parallel (substantially parallel) to a longitudinal direction of display device 100 is defined as the X-axis, a direction parallel (substantially parallel) to a short direction of display device 100 is defined as the Y-axis, and a direction orthogonal to both the X-axis and the Y-axis is defined as the Z-axis. Further, a vertical direction to an X-Z plane, that is, a Y-axis direction, is a gravity direction. Under an ordinary use condition, display device 100 is installed on an installation surface parallel (substantially parallel) to the X-Z plane. Further, a side facing a user (not illustrated) who watches display device 100 is defined as a "front surface", and a side opposite to the front surface is defined as a "back surface". A side relatively far from the installation surface in the Y-axis direction is defined as a "top", and a side relatively close to the installation surface in the Y-axis direction is defined as a "bottom". Note that these directions are relative directions illustrated conveniently, and are not absolute directions.

Display device 100 includes frame body 101, front surface member 102, display panel 103, light emitting unit 140, back surface board 108, and back surface cover 109.

Display device 100 described in the present exemplary embodiment is, for example, a television device that outputs an image and a sound obtained from a received broadcast wave, and includes a circuit board (not illustrated) or the like inside. Note that, since a configuration of the television device is substantially identical to a generally known configuration, description of the configuration is omitted.

Frame body 101, front surface member 102, and back surface cover 109 are members that cover display panel 103, light emitting unit 140, and the like. Frame body 101 is a member that protects an outer periphery of display panel 103 and the like. Front surface member 102 is a transparent member that covers a front surface of display panel 103. Back surface cover 109 is a member that protects a back surface of display panel 103 and the like.

Display panel 103 is a device that displays an image based on an input image signal. The image includes a still image, a moving image, and the like. The image also includes a character, a symbol, and the like. Display panel 103 described in the present exemplary embodiment is a liquid crystal display panel. Further, a thickness of display panel 103 ranges approximately from 1 mm to 3 mm, inclusive, for example. Note that a kind of display panel 103 is not particularly limited in the present disclosure. Any kind of display panel 103 may be used as long as display panel 103 requires light transmitted through display panel 103 when displaying an image.

Light emitting unit 140 is a member for emitting light having substantially uniform brightness to the back surface of display panel 103. Light emitting unit 140 is generally referred to as a "backlight" or the like. Light emitting unit 140 includes diffuser panel 104, reflective sheet 105, and light emitting module 106.

[1-2. Light Emitting Module]

Figure 3:
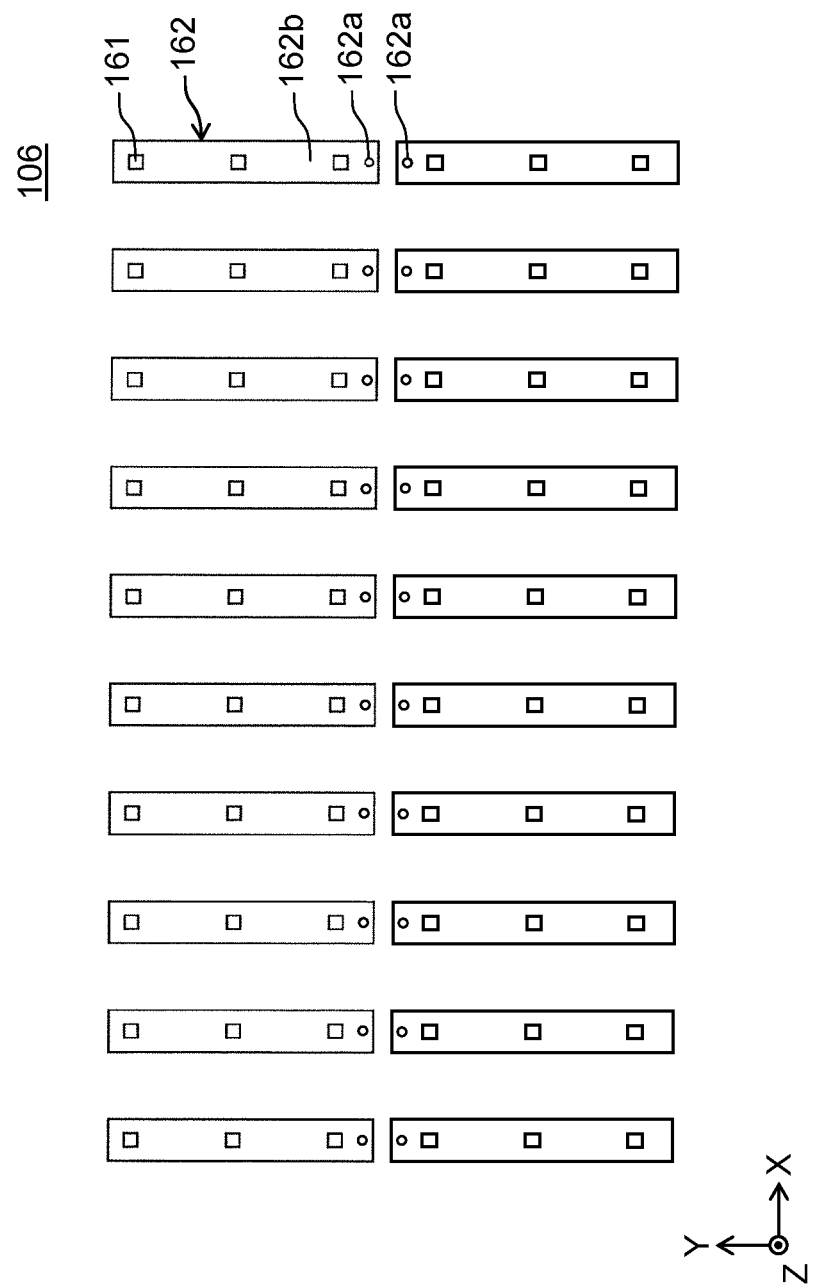
FIG. 3 is a view schematically illustrating a configuration example of a light emitting element and a mount board that configure a light emitting module according to the first exemplary embodiment.

FIG. 3 is a view schematically illustrating a configuration example of light emitting element 161 and mount board 162 that configure light emitting module 106 according to the first exemplary embodiment.

Figure 4:
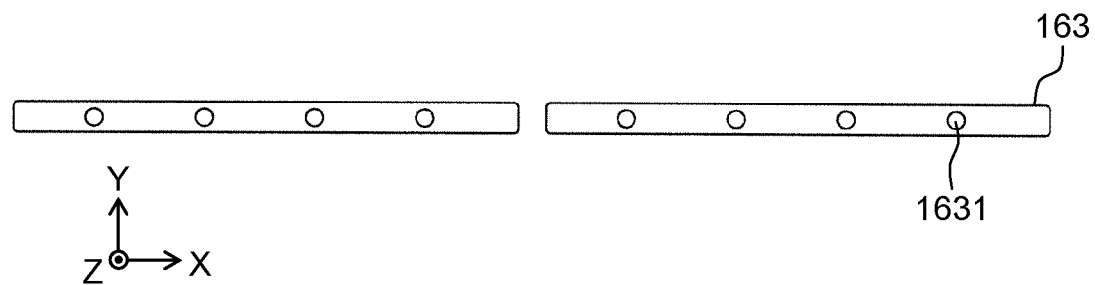
FIG. 4 is a view schematically illustrating an example of a relay board that configures the light emitting module according to the first exemplary embodiment.

FIG. 4 is a view schematically illustrating an example of relay board 163 that configures light emitting module 106 according to the first exemplary embodiment.

As illustrated in FIGS. 3 and 4, light emitting module 106 includes mount board 162, light emitting element 161, and relay board 163. A plurality of mount boards 162 having long-length shapes (long-length shapes in the Y-axis direction) is disposed along a longitudinal direction (the X-axis direction) and a short direction (the Y-axis direction) of display panel 103. A plurality of light emitting elements 161 is arrayed on each mount board 162 along a longitudinal direction (the Y-axis direction) of mount board 162. Relay board 163 is electrically connected to each of the plurality of mount boards 162.

(1-2-1. Mount Board)

Mount board 162 is a member used to facilitate arrangement of light emitting element 161 for back surface board 108. The plurality of light emitting elements 161 is arrayed on each mount board 162 along the longitudinal direction (the Y-axis direction) of mount board 162. Moreover, since mount boards 162 are placed on display panel 103 in a matrix shape as illustrated in FIG. 3, the plurality of light emitting elements 161 is arranged in a matrix shape along the longitudinal direction (the X-axis direction) and the short direction (the Y-axis direction) of display panel 103.

Mount board 162 includes contact point 162a electrically connected to relay board 163 and a conductive member (not illustrated) that electrically interconnects contact point 162a and each light emitting element 161. This conductive member is printed wiring, for example. In each mount board 162, power is supplied to each light emitting element 161 from relay board 163 electrically connected to contact point 162a. With this configuration, each light emitting element 161 mounted to mount board 162 is lit.

As mentioned above, in the present exemplary embodiment, the plurality of light emitting elements 161 is arrayed in a row on mount board 162 in the longitudinal direction of mount board 162. Mount board 162 is constituted of a long-length shaped flexible wiring board having a thickness ranging from 0.01 mm to 0.05 mm, inclusive, for example. Further, mount board 162 is stuck on back surface board 108 by an adhesive member (for example, a double-sided tape). Note that the flexible wiring board is a board in which an electric circuit is provided on a base material formed by sticking a thin and soft base film having insulation properties, such as polyimide, and a conductive metal, such as a copper foil. The flexible wiring board has flexibility. Further, the adhesive member may be an adhesive agent or the like.

An arrangement position of each mount board 162 is set such that an end including contact point 162a is disposed in recess 1081 (see FIG. 7) of back surface board 108, which will be described below. Accordingly, each mount board 162 is placed on back surface board 108. Then, a back surface of the end including contact point 162a of mount board 162 is stuck on recess 1081 by, for example, a double-sided tape.

Further, in each mount board 162, a layer having a light reflectance higher than a light reflectance of a body of mount board 162 is provided on a surface, on which light emitting elements 161 are arrayed, among a plurality of surfaces included in mount board 162. In the present exemplary embodiment, since a white solder resist is applied to the surface (the surface on which light emitting elements 161 are arrayed) of mount board 162, white resist film 162b (of a highly reflective type) having a light reflectance of 95% or more is formed as a layer having a high light reflectance. In the present exemplary embodiment, the light reflectance of resist film 162b may be 99.9%, for example. Note that a light reflectance of a generally known white resist film is about 90%.

(1-2-2. Light Emitting Element)

As mentioned above, the plurality of light emitting elements 161 is arrayed on each mount board 162 along the longitudinal direction (the Y-axis direction) of each mount board 162. Moreover, each light emitting element 161 emits light from behind display panel 103 toward display panel 103. In display device 100, since mount boards 162 are placed along the longitudinal direction (the X-axis direction) and the short direction (the Y-axis direction) of display panel 103, respectively, the plurality of light emitting elements 161 is arranged in the matrix shape along the longitudinal direction (the X-axis direction) and the short direction (the Y-axis direction) of display panel 103, respectively.

Note that a kind of light emitting element 161 is not particularly limited. For example, a white LED that emits white light may be used as light emitting element 161. The white LED can be realized by, for example, combining a blue light emitting diode and a fluorescent material that emits yellow light.

(1-2-3. Relay Board)

As illustrated in FIG. 4, for example, relay board 163 is constituted of a printed wiring board having a long-length shape (a long-length shape in the X-axis direction). Relay board 163 is a board used to supply power to light emitting element 161. Relay board 163 is placed in recess 1081 provided on back surface board 108 (see FIG. 7) such that the end (the end including contact point 162a) of mount board 162 is held between relay board 163 and back surface board 108. With this configuration, relay board 163 is in contact with the end (the end including contact point 162a) of mount board 162 disposed in recess 1081, and is electrically connected with contact point 162a of mount board 162. In other words, relay board 163 is placed in recess 1081 so as to be in contact with the end including contact point 162a of mount board 162, and is physically in contact with contact point 162a of mount board 162. Accordingly, relay board 163 is electrically connected with contact point 162a.

In the present exemplary embodiment, relay board 163 is, for example, constituted of a long-length shaped rigid board having a thickness appropriately ranging from 0.08 mm to 1.0 mm, inclusive. Further, relay board 163 is formed, on a surface on a side that is in contact with mount board 162 (a surface on a Z-axis negative direction side), with wiring for supplying power to light emitting element 161 through contact point 162a of mount board 162. Further, relay board 163 is provided with through-hole 1631 for fixing relay board 163 to back surface board 108 by a screw or the like.

Note that relay board 163 may be configured with a flexible wiring board. In a case of this configuration, recess 1081 may not be provided on back surface board 108, and through-hole 1631 may not be provided in relay board 163.

(1-3. Diffuser Panel)

Diffuser panel 104 is a member that diffuses light emitted from each light emitting element 161. For example, diffuser panel 104 is a plate-shaped transparent member having minute irregularity on only one side or both sides of diffuser panel 104. For example, diffuser panel 104 diffuses and emits light entered from a back surface side of diffuser panel 104 to substantially all directions from a front surface side of diffuser panel 104. With this configuration, diffuser panel 104 reduces visual angle dependency on brightness of light emitted from light emitting unit 140 (brightness of light that reaches a user is changed depending on an angle of display device 100 viewed by the user), and substantially equalizes the brightness of light emitted from light emitting unit 140.

Note that a configuration of diffuser panel 104 is not limited to the above-described configuration. For example, fine particles having a high optical reflectance may be dispersed and disposed inside diffuser panel 104. Alternatively, diffuser panel 104 may be formed by overlapping a plurality of films having minute irregularity.

(1-4. Reflective Sheet)

Figure 5:
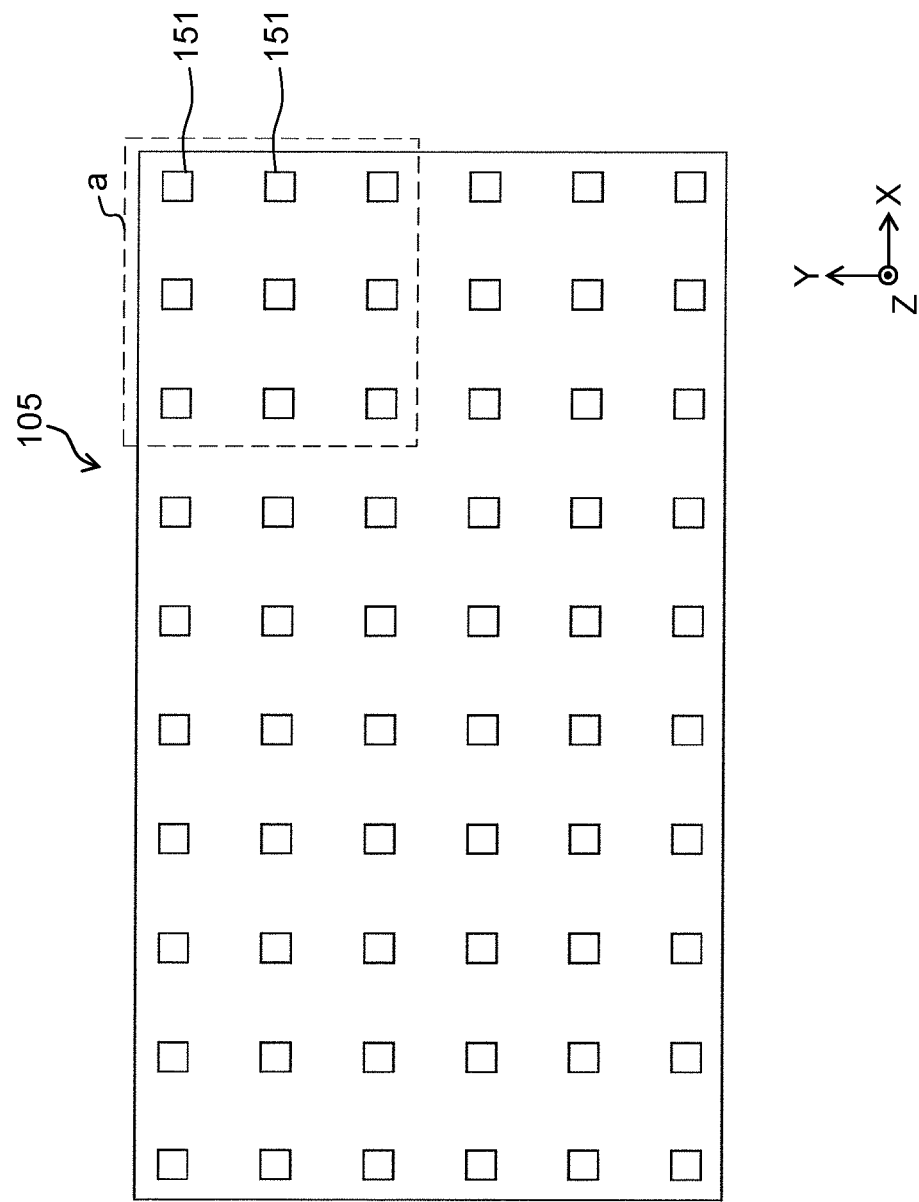
FIG. 5 is a view schematically illustrating an example of a reflective sheet according to the first exemplary embodiment.

FIG. 5 is a view schematically illustrating an example of reflective sheet 105 according to the first exemplary embodiment. FIG. 5 illustrates reflective sheet 105 before being mounted to back surface board 108.

Figure 6:
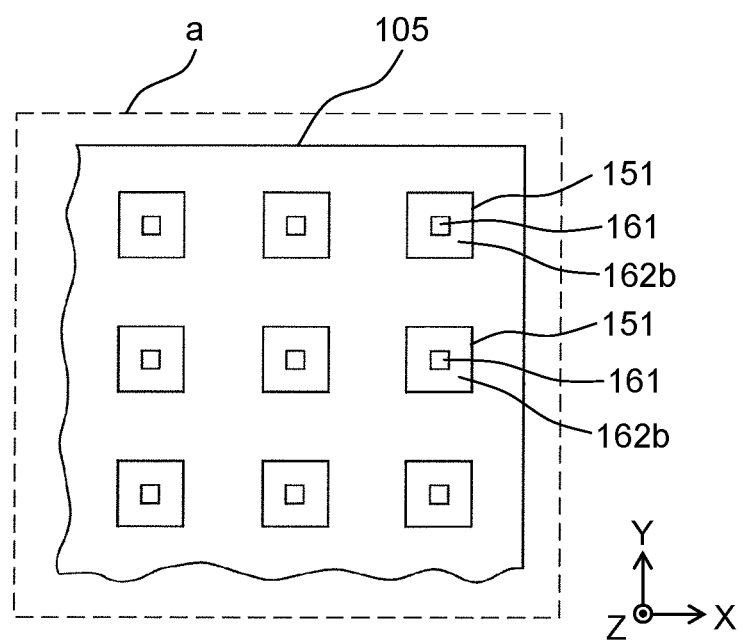
FIG. 6 is a view illustrating a part of the reflective sheet in an enlarged manner according to the first exemplary embodiment.

FIG. 6 is a view illustrating a part of reflective sheet 105 in an enlarged manner according to the first exemplary embodiment. FIG. 6 illustrates the part of reflective sheet 105 in an enlarged manner after being mounted to back surface board 108. Note that FIG. 6 illustrates area "a" surrounded by a broken line in FIG. 5.

Reflective sheet 105 has a plurality of holes 151. Reflective sheet 105 is mounted to back surface board 108 such that light emitting element 161 disposed on a surface of light emitting module 106 facing a back surface side of reflective sheet 105 is exposed to a front surface side of reflective sheet 105 through hole 151. Then, reflective sheet 105 reflects, among light beams emitted from light emitting element 161, a light beam that advances in a back surface direction (the Z-axis negative direction) toward display panel 103 (to a Z-axis positive direction side). Note that a material for forming reflective sheet 105 is not particularly limited. For example, a sheet member formed of synthetic resin, such as white polyethylene terephthalate (PET) excellent in light reflectivity, can be used for reflective sheet 105.

As illustrated in an example in FIG. 6, reflective sheet 105 has the plurality of (for example, a same number as a number of light emitting elements 161) holes 151 for allowing light emitting elements 161 to pass through at positions corresponding to light emitting elements 161 of mount boards 162 disposed on back surface board 108. Specifically, in reflective sheet 105, hole 151 that is larger than an outer shape of light emitting element 161 is provided at a position corresponding to each light emitting element 161 of mount boards 162 disposed on back surface board 108. Then, when reflective sheet 105 is mounted to back surface board 108, light emitting element 161 is inserted into hole 151. Note that each drawing illustrates an example in which hole 151 is formed in a quadrangular shape. However, hole 151 may be formed in a shape other than the quadrangular shape, such as a circular shape.

In the present exemplary embodiment, white resist film 162b (of the highly reflective type) having the light reflectance of 95% or more is formed on mount board 162. Accordingly, even when a part of a surface of mount board 162 (resist film 162b around light emitting element 161) is exposed from hole 151, resist film 162b can reflect the light from light emitting element 161 at relatively high light reflectance. With this configuration, in the present exemplary embodiment, a size of hole 151 can be made larger than the outer shape of light emitting element 161, as illustrated in FIG. 6. Specifically, in the present exemplary embodiment, when a size of light emitting element 161 in a top view ranges from 1 mm square to 3 mm square, inclusive, the size of hole 151 in the top view (the size of hole 151 when hole 151 is seen from the Z-axis positive direction side) is set so as to be ranging from 10 mm square to 15 mm square, inclusive (that is, 9 times or more of the outer shape (the size when viewed from the top) of light emitting element 161). Accordingly, in the present exemplary embodiment, light emitting element 161 is exposed from hole 151 of reflective sheet 105, and a part of white resist film 162b applied to mount board 162 (resist film 162b around light emitting element 161) is exposed from hole 151.

To compare with the present exemplary embodiment, a case where a light reflectance of a white resist film formed on mount board 162 is less than 95% (that is, a resist film that is not a highly reflective type is formed on mount board 162) is assumed. Alternatively, a case where white resist film 162b is not formed on mount board 162 is assumed. In such case, the surface of mount board 162 can only reflect the light from light emitting element 161 at a relatively low light reflectance. Therefore, in order to suppress an optical loss caused by exposure of the surface of mount board 162 having the relatively low light reflectance from hole 151, it is necessary to form the size of hole 151 almost equal to the outer shape of light emitting element 161, in such a way that the surface of mount board 162 around light emitting element 161 is not exposed from hole 151 as much as possible. For example, when the size of the outer shape of light emitting element 161 in the top view ranges from 1 mm square to 3 mm square, inclusive, exposure of the surface of mount board 162 around light emitting element 161 from hole 151 can be prevented by forming hole 151 with a size ranging from 1 mm square to 3 mm square, inclusive that is almost equal to the outer shape of light emitting element 161. However, in this configuration, when reflective sheet 105 is mounted to back surface board 108, it is difficult to insert light emitting element 161 into hole 151. Moreover, upon mounting of reflective sheet 105 to back surface board 108, an edge of hole 151 can be turned up when the edge of hole 151 touches or rubs against light emitting element 161. Accordingly, a lift (a lift from mount board 162) can occur on reflective sheet 105. Moreover, because of occurrence of such a lift, the light from light emitting element 161 can enter a gap caused by the lift, thereby causing an optical loss. By making the size of hole 151 sufficiently larger than the outer shape of light emitting element 161, light emitting element 161 is easily inserted into hole 151, and occurrence of the lift can be prevented. However, in this case, the surface of mount board 162 having the relatively low light reflectance is exposed from hole 151 of reflective sheet 105. Therefore, in order to suppress an optical loss in this case, for example, it is necessary that the surface of mount board 162 exposed from hole 151 is covered with a piece of reflective sheet by sticking the piece of reflective sheet on mount board 162 so as to surround light emitting element 161.

In the present exemplary embodiment, since white resist film 162b having the relatively high light reflectance (95% or more) is formed on the surface of mount board 162, even when the surface of mount board 162 is exposed from hole 151, an exposed area may not be covered with the piece of reflective sheet. In other words, in reflective sheet 105, the size of hole 151 can be made larger than the outer shape of light emitting element 161, thereby providing an ample space.

Reflective sheet 105 is stuck and fixed to back surface board 108 by a double-sided tape or the like. At this time, in display device 100, when reflective sheet 105 mounted to back surface board 108 is viewed from the front surface side (the Z-axis positive direction side) (that is, when viewed from the top), an end of mount board 162 and an end of hole 151 corresponding to the end of mount board 162 overlap each other (not illustrated). In other words, when viewed from the front surface side, reflective sheet 105 mounted to back surface board 108 has an area that overlaps with mount board 162 and an area that does not overlap with mount board 162 and is in contact with (or faces) back surface board 108. Moreover, the area of reflective sheet 105 that overlaps with mount board 162 near hole 151 is extruded to the front surface side by mount board 162. Note that reflective sheet 105 may have flexibility (elasticity) that can be bulged out (deformed) when a part of reflective sheet 105 is extruded.

In the present exemplary embodiment, mount board 162 is formed of a long-length shaped and comparatively thin (for example, a thickness ranging from 0.01 mm to 0.05 mm, inclusive) flexible wiring board. Further, the size of hole 151 is larger than the outer shape of light emitting element 161, thereby providing an ample space. Accordingly, when reflective sheet 105 is stuck on back surface board 108, even though the area of reflective sheet 105 that overlaps with mount board 162 is slightly extruded to the front surface side, reflective sheet 105 is not bulged out (deformed). To compare with the present exemplary embodiment, a case where the thickness of mount board 162 is relatively large is assumed. In this case, the area of reflective sheet 105 that overlaps with mount board 162 is extruded to the front surface side, and a lift (a lift from mount board 162) of reflective sheet 105 can occur at an edge of hole 151. Then, the aforementioned optical loss can occur due to this lift. To suppress this optical loss, it is necessary that the lift is suppressed by sticking a piece of the reflective sheet on reflective sheet 105 and a surface of mount board 162 over the edge of hole 151, for example. In the present exemplary embodiment, since mount board 162 is formed of the flexible wiring board as mentioned above, when reflective sheet 105 is stuck on back surface board 108 by a double-sided tape or the like, the lift from mount board 162 of the area of reflective sheet 105 that overlaps with mount board 162 is suppressed. Accordingly, it is not necessary to use the above-described piece of reflective sheet or the like for suppressing the lift of reflective sheet 105.

[1-5. Back Surface Board]

Figure 7:
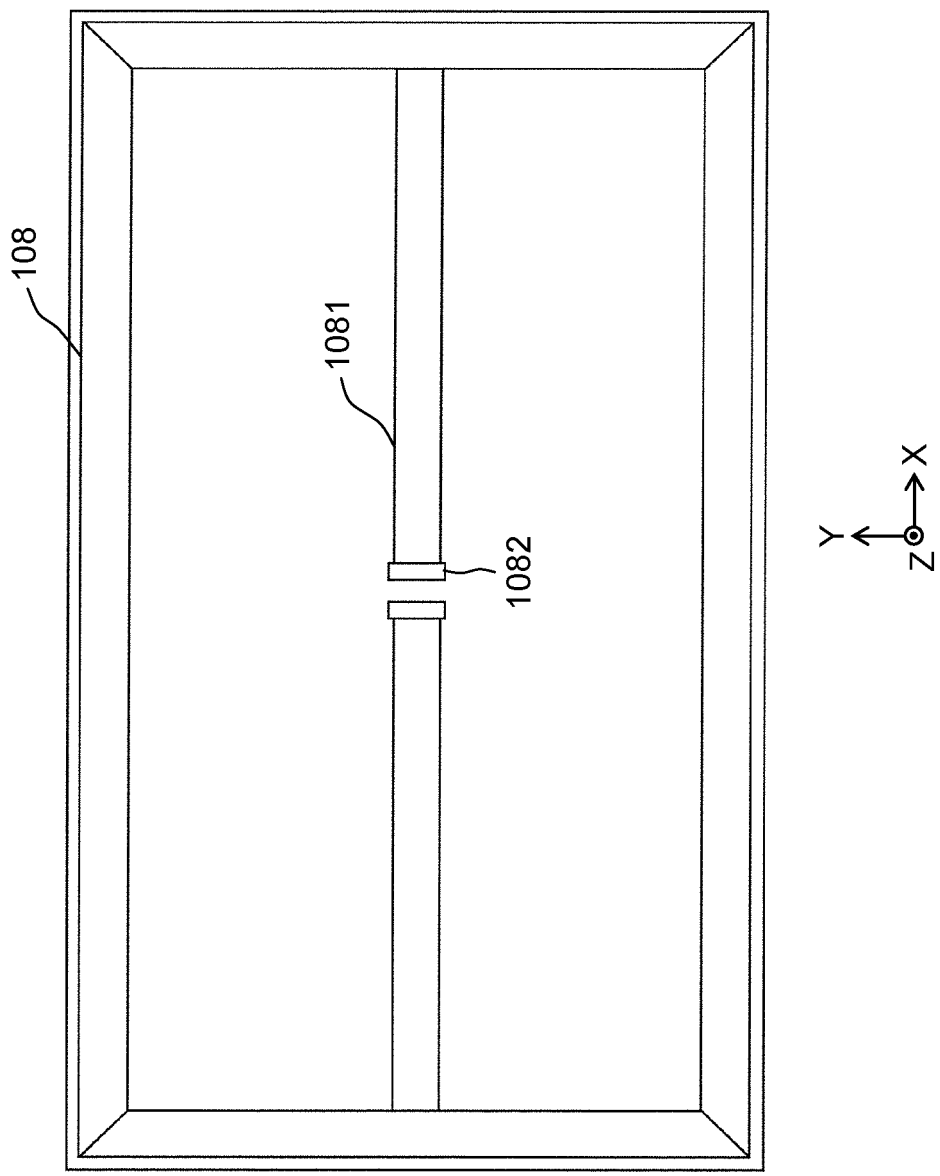
FIG. 7 is a view schematically illustrating an example of a back surface board according to the first exemplary embodiment.

FIG. 7 is a view schematically illustrating an example of back surface board 108 according to the first exemplary embodiment. FIG. 7 illustrates back surface board 108 before light emitting unit 140 is mounted.

Figure 8:
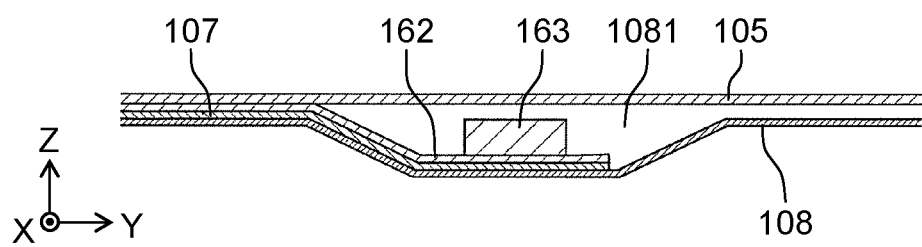
FIG. 8 is a partially sectional view schematically illustrating a configuration example of a recess of the back surface board according to the first exemplary embodiment.

FIG. 8 is a partially sectional view schematically illustrating a configuration example of recess 1081 of back surface board 108 according to the first exemplary embodiment. FIG. 8 illustrates an outline of an inside of recess 1081 after light emitting unit 140 is mounted.

Back surface board 108 is a plate-shaped member that holds display panel 103. As shown in FIG. 2, back surface board 108 is disposed on the back surface (a surface on the Z-axis negative direction side) of display panel 103. Further, back surface board 108 holds light emitting unit 140 between display panel 103 and back surface board 108, and holds a circuit board (not illustrated) or the like on a back surface of back surface board 108. For example, back surface board 108 is formed by using a metal plate material generally referred to as a "chassis". Further, irregularity is provided on back surface board 108 by press working or the like to improve structural strength or the like.

In the present exemplary embodiment, back surface board 108 includes recess 1081 and hole 1082.

Recess 1081 is provided in a long-length shape in a longitudinal direction (the X-axis direction) of back surface board 108. For example, as illustrated in FIG. 8, relay board 163 and one end (an end including contact point 162a) of mount board 162 are placed in recess 1081. A depth (a size in the Z-axis direction) of recess 1081 is, for example, set so as to be almost equal to a size in which a thickness of mount board 162 is added to a thickness of relay board 163. Note that, in the present exemplary embodiment, as illustrated in FIG. 8, mount board 162 is stuck on back surface board 108 by double-sided tape 107. Moreover, since mount board 162 has flexibility, the one end (the end including contact point 162a) of mount board 162 is also stuck on back surface board 108 by double-sided tape 107 even in recess 1081. In this way, the one end of mount board 162 is placed in recess 1081.

Hole 1082 is used to electrically connect the circuit board (not illustrated) or the like held on the back surface of back surface board 108 and relay board 163 (for example, to pass through electrical wiring).

Note that a boss for screwing or the like may be mounted to back surface board 108. Further, back surface board 108 may be disposed so as to cover an entire surface (or an almost entire surface) of the back surface of display panel 103, or may have a function of radiating heat generated from display panel 103.

[1-6. Effects and Others]

As described above, in the present exemplary embodiment, a display device includes: a display panel that displays an image; a plurality of mount boards having long-length shaped disposed along the display panel; and light emitting elements arrayed on each of the plurality of mount boards in a longitudinal direction of each of the plurality of mount boards. The light emitting elements emit light toward the display panel from behind the display panel, and are arranged in a matrix shape along the display panel. The display device further includes: a back surface board on which the plurality of mount boards is stuck by an adhesive member; and a reflective sheet mounted to the back surface board. The reflective sheet has holes that allow the light emitting elements to pass through at the positions corresponding to the light emitting elements, and reflects the light emitted from the light emitting elements toward the display panel. Each of the plurality of mount boards is constituted of a flexible wiring board.

Note that display device 100 is an example of the display device. Display panel 103 is an example of the display panel. Mount board 162 is an example of the mount board. Light emitting element 161 is an example of the light emitting element. Double-sided tape 107 is an example of the adhesive member. Back surface board 108 is an example of the back surface board. Hole 151 is an example of the hole that allows the light emitting element to pass through. Reflective sheet 105 is an example of the reflective sheet.

The display device configured in this way can reduce a heat loss and an optical loss.

For example, display device 100 described in the first exemplary embodiment includes: display panel 103 that displays an image; the plurality of long-length shaped mount boards 162 disposed along display panel 103; and light emitting elements 161 arrayed on each of the plurality of mount boards 162 in the longitudinal direction of each of the plurality of mount boards 162. Light emitting elements 161 emit light toward display panel 103 from behind display panel 103, and are arranged in a matrix shape along display panel 103. Display device 100 further includes: back surface board 108 on which the plurality of mount boards 162 is stuck by double-sided tape 107; and reflective sheet 105 mounted to back surface board 108. Reflective sheet 105 has holes 151 that allow light emitting elements 161 to pass through at the positions corresponding to light emitting elements 161, and reflects the light emitted from light emitting elements 161 toward display panel 103. Each of the plurality of mount boards 162 is constituted of the flexible wiring board.

Therefore, display device 100 can reduce a heat loss and an optical loss.

In the display device according to the present exemplary embodiment, a thickness of the flexible wiring board may range from 0.01 mm to 0.05 mm, inclusive.

In display device 100 configured in this way, mount board 162 is constituted of the long-length shaped relatively thin flexible wiring board. Accordingly, thermal resistance in mount board 162 can be greatly reduced, compared with a case where a mount board is constituted of a long-length shaped rigid board having a thickness of about 1 mm. With this configuration, in display device 100, the heat generated from light emitting element 161 can also be radiated from mount board 162, thereby reducing the heat loss.

Further, in display device 100 configured as above, mount board 162 can be stuck on back surface board 108 by a double-sided tape or the like, without providing a recess for placing mount board 162 on back surface board 108. Moreover, a lift of reflective sheet 105 can be also suppressed. With this configuration, display device 100 can suppress an optical loss caused by the lift of reflective sheet 105. This effect will be described with reference to FIGS. 9 and 10.

Figure 9:
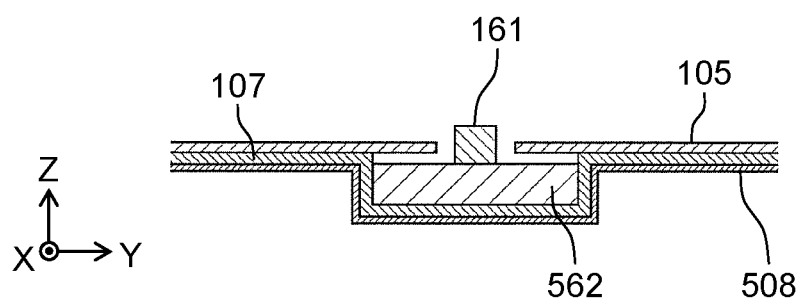
FIG. 9 is a schematic view for describing a lift of a reflective sheet from a mount board according to a comparative example.

FIG. 9 is a schematic view for describing a lift of reflective sheet 105 from mount board 562 according to a comparative example.

Figure 10:
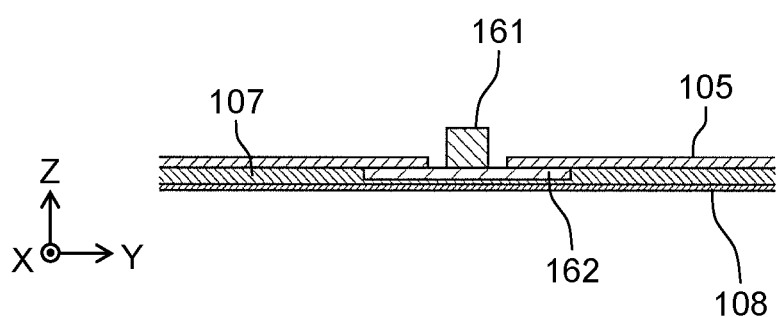
FIG. 10 is a schematic view for describing overlapping of the reflective sheet and the mount board according to the first exemplary embodiment.

FIG. 10 is a schematic view for describing overlapping of reflective sheet 105 and mount board 162 according to the first exemplary embodiment.

The comparative example shown in FIG. 9 illustrates an example in which mount board 562 is constituted of a long-length shaped rigid board having a thickness of 1 mm. In the comparative example shown in FIG. 9, a recess for placing mount board 562 is provided on back surface board 508. This recess is provided to suppress the lift of reflective sheet 105. Without this recess, as mentioned above, the lift of reflective sheet 105 can occur due to the thickness of mount board 562. This recess is set at a depth (a size in a Z-axis direction) according to the thickness of mount board 562, and is formed on back surface board 508 by press working, for example. However, it is difficult to form this recess with high precision by the press working. For example, if the depth of this recess is smaller than a set value, mount board 562 protrudes from the recess to a front surface side (a Z-axis positive direction side). Accordingly, the lift of reflective sheet 105 can occur, as mentioned above. Alternatively, if the depth of this recess is larger than the set value, as illustrated in FIG. 9, when mount board 562 is stuck and placed on this recess by double-sided tape 107, a gap is generated between a surface of mount board 562 and reflective sheet 105. Accordingly, the lift of reflective sheet 105 can occur. Moreover, when these lifts of reflective sheet 105 occur, light from light emitting elements 161 arrayed on mount board 562 enters the gap caused by the lift, thereby causing an optical loss.

On the other hand, as illustrated in FIG. 10, in the present exemplary embodiment, mount board 162 is constituted of a relatively thin (for example, a thickness ranging from 0.01 mm to 0.05 mm, inclusive) flexible wiring board. Accordingly, there is no need to provide the recess, as illustrated in FIG. 9, for placing mount board 162 on back surface board 108, and a process and a cost required for manufacturing display device 100 can be suppressed. Moreover, even if the recess as illustrated in FIG. 9 is not provided on back surface board 108, occurrence of a lift of reflective sheet 105 is suppressed, and mount board 162 can be stuck on back surface board 108 by double-sided tape 107 directly (that is, without providing a recess). Note that, even if mount board 162 extrudes a part of reflective sheet 105 near hole 151 to the front surface side (the Z-axis positive direction side) (that is, a bulge occurs near hole 151 of reflective sheet 105) due to the thickness of mount board 162, mount board 162 is relatively thin and, for example, only has a thickness ranging approximately from 0.01 mm to 0.05 mm, inclusive. Accordingly, even if a lift of reflective sheet 105 occurs, the lift can be kept small so as to cause substantially no problem.

In this way, in display device 100 of the present exemplary embodiment, since mount board 162 has the above-described configuration, the lift of reflective sheet 105 is prevented, and the optical loss caused by the lift of reflective sheet 105 can be reduced.

In the display device according to the present exemplary embodiment, a white solder resist having a light reflectance of 95% or more may be applied to the surface, on which the light emitting elements are arrayed, among a plurality of surfaces included in each of the plurality of mount boards.

In the display device according to the present exemplary embodiment, when a size of each of the light emitting elements in a top view ranges from 1 mm square to 3 mm square, inclusive, a size of each of the holes in the top view may range from 10 mm square to 15 mm square, inclusive.

Note that resist film 162*b* is an example of the film formed by applying the white solder resist having the light reflectance of 95% or more.

For example, in display device 100, the white solder resist having the light reflectance of 95% or more is applied to the surface, on which light emitting elements 161 are arrayed, among the plurality of surfaces included in each of the plurality of mount boards 162. Accordingly, resist film 162*b* is formed. Further, when the size of each of light emitting elements 161 in the top view ranges from 1 mm square to 3 mm square, inclusive, the size of each of holes 151 in the top view ranges from 10 mm square to 15 mm square, inclusive.

In display device 100 configured in this way, the size of hole 151 provided in reflective sheet 105 is considerably larger than the outer shape of light emitting element 161. Accordingly, the area in which mount board 162 and reflective sheet 105 overlap each other can be reduced. With this configuration, since the lift of reflective sheet 105 can be further suppressed, the optical loss caused by the lift of reflective sheet 105 can be reduced.

In the display device according to the present exemplary embodiment, the reflective sheet may be stuck on the back surface board by the adhesive member. Further, an end of each of the plurality of mount boards and an end of each of holes, among the holes, corresponding to the end of each of the plurality of mount boards may overlap each other when viewed from the top.

For example, in display device 100, reflective sheet 105 may be stuck on back surface board 108 by double-sided tape 107. Further, the end of each of the plurality of mount boards 162 and the end of each of holes 151 corresponding to the end of each of the plurality of mount boards 162 may overlap each other when viewed from the top. In display device 100 configured in this way, double-sided tape 107 for fixing mount board 162 can be also used for fixing reflective sheet 105.

The display device according to the present exemplary embodiment may further include a relay board having a long-length shape for supplying power to the light emitting elements. In the display device, on a surface of the back surface board on which the plurality of mount boards is stuck, a recess depressed toward an opposite surface of the surface on which the plurality of mount boards is stuck may be provided in a direction perpendicular to the longitudinal direction of each of the plurality of mount boards. Moreover, in the display device, when the relay board is placed in the recess, and is placed at an end of each of the plurality of mount boards located in the recess, the relay board may be electrically connected with each of the plurality of mount boards.

Note that relay board 163 is an example of the relay board. Recess 1081 is an example of the recess.

For example, display device 100 according to the present exemplary embodiment further includes long-length shaped relay board 163 for supplying power to light emitting elements 161. In display device 100, on the surface of back surface board 108 on which the plurality of mount boards 162 is stuck, recess 1081 depressed toward an opposite surface of the surface on which the plurality of mount boards 162 is stuck is provided in the direction perpendicular to the longitudinal direction of each of the plurality of mount boards 162. Moreover, in display device 100, relay board 163 is placed in recess 1081, and is placed at the end of each of the plurality of mount boards 162 located in recess 1081. Accordingly, relay board 163 is electrically connected with each of the plurality of mount boards 162.

In this way, in display device 100 of the present exemplary embodiment, relay board 163 can be placed in recess 1081 by providing recess 1081 on back surface board 108. Moreover, since mount board 162 is constituted of the flexible wiring board having flexibility, the end (the end including contact point 162*a*) of mount board 162 can be deformed along the shape of recess 1081 and placed in recess 1081. With this configuration, in display device 100, since an electrically connected portion between relay board 163 and mount board 162 can be disposed in recess 1081, relay board 163 that supplies power to mount board 162 can realize a configuration that does not push up reflective sheet 105. Accordingly, in display device 100, bending or the like of reflective sheet 105 hardly occurs, and spots of reflected light caused by the bending or the like of reflective sheet 105 can be reduced.

Other Exemplary Embodiments

As described above, the first exemplary embodiment has been described to exemplify the technique in the present disclosure. The accompanying drawings and detailed description are provided for the description.

However, the present disclosure is not limited to the above-mentioned exemplary embodiment. The components described in the accompanying drawings and the detailed description may include not only the components essential for solving the problem but also components that are not essential for solving the problem in order to illustrate the above-described technique. For this reason, those nonessential components that are illustrated in the accompanying drawings and are described in the detailed description should not be immediately acknowledged as essential.

Further, since the above exemplary embodiment exemplifies the technique in the present disclosure, various modifications, substitutions, additions and omissions can be performed within the scope of claims and equivalent scope of claims. In addition, new exemplary embodiments can be made by combining components described in the first exemplary embodiment. In addition, other exemplary embodiments implemented by excluding some of the components may become exemplary embodiments of the present disclosure. In addition, modifications obtainable through various changes to the above exemplary embodiment that are conceived by those skilled in the art without departing from the essence of the present disclosure, that is to say, the meaning of the recitations in the claims are also included in the present disclosure.

INDUSTRIAL APPLICABILITY

The present disclosure is applicable to a display device that displays an image, a character, a moving image, or the like, by using a backlight. Specifically, the present disclosure is applicable to an electronic device, such as a television device, a monitor, a digital signage, a mobile terminal, a tablet terminal, or a table type display device.

REFERENCE MARKS IN THE DRAWINGS

100: display device
101: frame body
102: front surface member
103: display panel
104: diffuser panel
105: reflective sheet
106: light emitting module
107: double-sided tape
108, 508: back surface board
109: back surface cover
140: light emitting unit
151, 1082: hole
161: light emitting element
162, 562: mount board
162a: contact point
162b: resist film
163: relay board
1081: recess
1631: through-hole

The invention claimed is:

1. A display device comprising:
a display panel that displays an image;
a plurality of mount boards having long-length shapes disposed along the display panel;
light emitting elements arrayed on each of the plurality of mount boards in a longitudinal direction of each of the plurality of mount boards, the light emitting elements emitting light toward the display panel from behind the display panel, and being arranged in a matrix shape along the display panel;
a back surface board on which the plurality of mount boards is stuck by an adhesive member;
a reflective sheet mounted to the back surface board, the reflective sheet having holes that allow the light emitting elements to pass through at positions corresponding to the light emitting elements, and reflecting the light emitted from the light emitting elements toward the display panel; and
a relay board having a long-length shape for supplying power to the light emitting elements,
wherein each of the plurality of mount boards is constituted of a flexible wiring board,
on a surface of the back surface board on which the plurality of mount boards is stuck, a recess depressed toward an opposite surface of the surface on which the plurality of mount boards is stuck is provided in a direction perpendicular to the longitudinal direction of each of the plurality of mount boards, and
when the relay board is placed in the recess and is placed at an end of each of the plurality of mount boards located in the recess, the relay board is electrically connected with each of the plurality of mount boards.

2. The display device according to claim 1, wherein a thickness of the flexible wiring board ranges from 0.01 mm to 0.05 mm, inclusive.

3. The display device according to claim 1, wherein a white solder resist having a light reflectance of 95% or more is applied to a surface, on which the light emitting elements are arrayed, among a plurality of surfaces included in each of the plurality of mount boards.

4. The display device according to claim 3, wherein when a size of each of the light emitting elements in a top view ranges from 1 mm square to 3 mm square, inclusive, a size of each of the holes in the top view ranges from 10 mm square to 15 mm square, inclusive.

5. The display device according to claim 1,
wherein the reflective sheet is stuck on the back surface board by the adhesive member, and an end of each of the plurality of mount boards and an end of each of holes, among the holes, corresponding to the end of each of the plurality of mount boards overlap each other when viewed from the top.

* * * * *